United States Patent [19]
Michael et al.

[11] Patent Number: 5,912,984
[45] Date of Patent: Jun. 15, 1999

[54] METHOD AND APPARATUS FOR IN-LINE SOLDER PASTE INSPECTION

[75] Inventors: David J. Michael, Newton; Juha Koljonen, Needham; Sanjay Nichani, Framingham; Peter Roberts, Dedham, all of Mass.

[73] Assignee: Cognex Corporation, Natick, Mass.

[21] Appl. No.: 08/769,739

[22] Filed: Dec. 19, 1996

[51] Int. Cl.[6] .................................................... G06K 9/00
[52] U.S. Cl. .......................................... 382/149; 382/181
[58] Field of Search ......................... 348/87, 130; 438/7, 438/669; 430/311, 396; 250/492.1; 382/146, 147, 151, 195, 145, 141, 142, 143, 144, 148, 149, 150, 152, 153, 154, 181, 190, 209, 218, 224, 275, 276, 286, 293, 302, 305, 307, 312, 168, 170, 173, 199, 217, 225

[56] References Cited

U.S. PATENT DOCUMENTS

| | | | |
|---|---|---|---|
| 4,731,863 | 3/1988 | Sezan et al. | 382/51 |
| 4,783,826 | 11/1988 | Koso | 382/147 |
| 4,876,457 | 10/1989 | Bose | 250/563 |
| 5,054,100 | 10/1991 | Tai | 382/47 |
| 5,082,800 | 1/1992 | Niinobu et al. | 382/145 |
| 5,153,925 | 10/1992 | Tanioka et al. | 382/52 |
| 5,212,740 | 5/1993 | Paek et al. | 382/22 |
| 5,311,598 | 5/1994 | Bose et al. | 382/8 |
| 5,325,443 | 6/1994 | Beatty et al. | 382/8 |
| 5,436,979 | 7/1995 | Gray et al. | 382/141 |
| 5,481,620 | 1/1996 | Vaidyanathan | 382/169 |
| 5,495,535 | 2/1996 | Smilansky et al. | 382/145 |
| 5,640,199 | 6/1997 | Garakani et al. | 382/146 |
| 5,753,416 | 5/1998 | Okamoto et al. | 430/311 |

OTHER PUBLICATIONS

Automated Vision System for Inspection of IC Pads and Bonds, Sreenivasan et al., *IEEE Transactions on Components, Hybrids, and Manufacturing Technology*, pp. 335–338, vol. 16, No. 3, May 1993.

Discrimination of Planar Shapes Using Shape Matrices, Taza et al. *IEEE Transactions on Systems, Man, and Cybernetics*, pp. 1281–1289, vol. 19, No. 5., Oct. 1989.

Subpixel Image Registration Using Circular Fiducials, Efrat et al., *IEEE*, pp. 49–58, 1993, (No Place of Publication).

Primary Examiner—Leo H. Boudreau
Assistant Examiner—Bijan Tadayon
Attorney, Agent, or Firm—Brian Michaelis; Russ Weinzimmer

[57] ABSTRACT

Inspection of solder paste on a printed circuit board using a before printing image (pre-image) to normalize an after printing image (post-image) of the printed circuit board. Existing lighting and optics used for alignment of the screen printing stencil to the printed circuit board are used for the solder paste inspection. A stencil in the screen printing process is also inspected using a before printing image (pre) to normalize an after printing image (post) of the stencil.

33 Claims, 5 Drawing Sheets

METHOD AND APPARATUS FOR IN-LINE SOLDER PASTE INSPECTION

FIELD OF THE INVENTION

The present invention relates to machine vision and automated inspection systems, and more particularly to a method and apparatus for inspection of solder paste screen printed on printed circuit boards using a stencil.

BACKGROUND OF THE INVENTION

The process of assembling printed circuit boards (PCBs) generally requires solder paste to be applied to the printed circuit board before components, such as integrated circuits and discrete devices, are placed and ultimately secured onto the board. Initially, the sticky solder paste temporarily holds the components in place on the PCB until the solder paste is melted or reflowed. When the solder paste is reflowed it forms both mechanical and electrical connections between the components and the board. If there is not enough solder paste, components may be inadequately mechanically and/or electrically connected to the PCB. If there is too much solder paste or if solder paste is deposited in the wrong place, an extra or incorrect electrical connection such as a short circuit may result, generally referred to as a "solder bridge".

Automated processes for fabricating PCBs are generally known, including process steps for applying solder paste to printed circuit boards using screen printing techniques. Prior to printing, a thin metal stencil or template is constructed with openings or apertures matching appropriate places on a particular PCB where paste should be printed. During printing the stencil is aligned to the PCB. The solder paste is then applied to the PCB through the stencil openings, typically using a squeegee to spread the paste. Then the stencil is lifted off of the PCB which is transported to its next manufacturing process step.

Automatic inspection or vision systems may be used in known processes to detect problems in the printing process, including problems associated with the stencil and problems associated with the application of paste to the PCBs. Stencil blockage may be detectable wherein dried solder paste or debris causes stencil openings to clog. It is desirable to detect stencil blockage by inspecting the stencil before any printed circuit boards are actually misprinted with solder paste. Stencil smearing may be detectable wherein solder paste smears around the stencil openings on a side of the stencil adjacent to the PCB. It is also desirable to detect stencil smearing by inspecting the stencil before any boards are actually misprinted with solder paste. Misalignment of the stencil and PCB may be detectable prior to distribution of solder paste by inspection of the stencil position relative to the PCB before printing thereon. The PCB can be inspected to detect incorrect solder paste distribution after printing. Automatic inspection may be used to determine if there is too little solder paste, too much solder paste, or solder paste in the wrong place on the printed circuit board.

The automated inspection of solder paste on PCBs is inherently difficult to accomplish. The solder paste is difficult to identify on the PCB because it is variable in terms of its appearance. The paste appearance varies over time, e.g. wet paste has a different appearance than dry paste. The paste has texture and the gray level reflectance of the paste is similar to solder pads with tinning and other circuitry on the PCB. Also, the three dimensional shape of the paste causes shadowing, making automated inspection difficult. The inherent difficulty is exacerbated by variability from one PCB to the next. For example, the color of boards of a single board type in one printing run can vary from light green to dark green or blue. In one printing run, the relative positioning of portions or all of a PCB of a single board type may vary with respect to the stencil or solder mask on the board. Additionally, all of the circuitry on a board is subject to dimensional variability. Perhaps most significantly, the solder paste deposited on a board can obscure solder pads beneath it making it impossible to tell either what is beneath the solder paste or what is the relative alignment of the solder paste to what is beneath it. For instance, if the solder paste is exactly the same size and shape as the solder pad beneath it, it may be impossible to tell whether there is perfect coverage or no coverage at all.

Known in-line or image automated inspection systems for solder paste inspection do not adequately overcome such difficulties. Some known systems typically only perform inspection based on an image of the PCB captured after the solder paste has been deposited thereon (referred to hereinafter as "post-only" systems). Known post-only systems typically use a vision/inspection tool that assigns grey scale values to pixels of a captured image of a PCB under inspection after printing. Pixels are classified as being not-paste or paste based on their grey scale value. Pixels are aggregated for particular areas of interest on the PCB, in a connectivity analysis in which pixels connected to one another and identified as being paste are labelled as belonging to the same lump of paste. Characteristics of interest related to the aggregation of pixels, such as area, center of mass, and size of enclosing rectangle, are determined and ultimately used by an operator to adjust parameters of the printing process to maintain the post-printing product within acceptable tolerances.

Unfortunately, color variation in the underlying areas of the PCB negatively affects the inspection process because grey scale values will vary according to the color variation of the underlying portions of the PCB, especially near the paste edge where the solder paste is thin. Variability in color/composition of the solder paste may also cause grey scale variations that negatively affect the inspection process. Similarly, known post-only systems may be negatively affected by lighting, which must be rigorously controlled in order to avoid negative affects on the inspection process due to shading or reflection of light from components of the system. In general, the yield and accuracy of known post-only solder inspection systems are not sufficient to make such systems useful or practicable.

Many known solder paste inspection systems are stand-alone (i.e. not "in-line") stations dedicated to performing solder paste inspection apart from and subsequent to the screen printing process step(s). Such stand-alone systems include optics and lighting that are optimally configured for the inspection of solder paste. The optics and lighting dedicated to solder paste inspection represent costly, redundant hardware in the PCB fabrication process flow in that similar optics and lighting are necessary upstream in the process flow to effect registration or alignment in the screen printing stage. Furthermore, stand-alone solder paste inspection systems typically incorporate laser stripers and other very expensive and sophisticated hardware that is often difficult to justify in a cost/benefit analysis. Stand-alone systems disadvantageously introduce additional machine set-up time and maintenance, require additional factory floor space to implement, and introduce additional undesirable handling of PCBs to convey them through the stand-alone inspection stage. Generally, a stand-alone solder inspection system will represent a significant overall reduction in throughput in a PCB fabrication line.

SUMMARY OF THE INVENTION

The present invention provides a method and apparatus implemented in a screen printing process, for in-line inspection of solder paste on a printed circuit board using a before printing image (pre-image) to normalize an after printing image (post-image) of the printed circuit board. A stencil in the screen printing process is also inspected using a before printing image (pre) to normalize an after printing image (post) of the stencil. Existing lighting and optics used for alignment of the screen printing stencil to the printed circuit board are used for the solder paste inspection.

According to the invention, solder paste on printed circuit boards is automatically inspected in an operation in which stencil and/or board design information and/or images of the stencil and board are acquired and stored before solder paste printing (pre-image data). A first registration technique is used to register, i.e. align, acquired pre-image data to model information acquired during a training procedure. Registration aligns a coordinate system associated with one image, e.g. the pre-image, to a coordinate system associated with another image, e.g. a model image or model information. Images of the stencil and printed circuit board after solder paste printing are also acquired and stored (post-image data). A second registration technique is used to align the two sets of information, i.e. the pre and post images. The pre-image and the post-image are subtracted to provide a difference image or information constituted by first signed pixel values representative of solder paste screen printed on areas of interest, i.e. solder pads, and second signed pixel values representative of solder paste screen printed on the board in areas other than on the areas of interest, e.g. on the board itself. The subtraction image is duplicated and processed to provide a solder paste/pad image with information related to solder paste located on pads and a non-pad/paste image with information related to solder paste located other than on pads.

Masks are created from the pre-image to effect a separation of the image into on-pad regions or an image having on-pad area information related to solder pads, and off-pad regions or an image having off-pad area information related to other printed circuit board background areas, i.e. other than on-pad areas. The mask information is used to process separately on-pad area information and off-pad area information. The on-pad mask is logically ANDed with the solder paste/pad image to form an on-pad difference image representative of the position of solder paste on the pads. The off-pad mask is logically ANDed with the non-pad/paste image to form an off-pad difference image representative of the position of solder paste on areas of the board other than the pads. The on-pad difference image and the off-pad difference image are converted, using thresholding operations with different respective thresholds, to respective first and second binary images, which are in turn combined to form a single binary image representative of solder paste on the printed circuit board. The thresholds are locally adjusted, that is, every pixel in the image has its own threshold, based on the pre-image, so that when the pre-image gray scale value is nearer to the paste gray scale value the threshold is (linearly) smaller. The single binary image is then analyzed using a connected components analysis method as known in the art, or by using a known vision tool to measure paste distribution and/or to determine information regarding the solder paste, such as, area, center of mass, orientation, etc. From the paste area distribution and two sets of image registrations, other useful quantities can be derived such as indications of bridging between solder blobs and print offset(s).

In further accord with the invention, the stencil used in the screen printing process is inspected in a manner substantially similar to the inspection of the solder paste on the board, using stencil pre-printing image data and post-printing image data. The stencil is inspected in areas of interest, such as interior to stencil apertures or openings in order to detect aperture blockage, and exterior to the periphery of the stencil openings in order to detect smearing. Stencil inspection may be effected prior to solder paste inspection to facilitate the efficient acquisition of information used in the solder paste inspection process.

Features of the invention include provision of an automated inspection system, used in-line during screen printing of PCBs, that avoids redundant hardware and associated cost by effecting inspection using existing lighting and/or optics present in the screen printing equipment for alignment purposes. The method for inspection according to the invention can be implemented in systems having existing optics and lighting used for alignment purposes or it can be retrofitted into systems having mechanical or other alignment means by adding the necessary lighting and optics in support of the inspection process. The technique implemented according to the invention normalizes each board by an image of that same board without paste and therefore avoids problems associated with prior art post-only inspection systems resulting from variations in board color, solder mask shifting and/or board or component dimension variability.

Various problems with prior art solder paste inspection systems are overcome by the method and apparatus according to the invention, including problems resulting from pads being covered by paste so that they are not visible or otherwise discernable, and problems resulting from an inability to differentiate between pads that have no paste on them and pads that are exactly 100% covered by paste. The method and apparatus according to the invention benefits from implementation of a registration mechanism which facilitates a determination as to whether the paste is in the correct location. Implementation of the registration mechanism in conjunction with a subtraction procedure facilitates differentiation between 0% and 100% coverage. Additionally, the solder paste inspection implementation according to the invention is flexible and extensible in that the registration, subtraction and masking procedures facilitate use of different algorithms for inspecting paste on pad, circuitry, bare board, mask, etc.

BRIEF DESCRIPTION OF THE DRAWING

The foregoing and other features and advantages of the present invention will be more fully understood from the following detailed description of illustrative embodiments, taken in conjunction with the accompanying drawing in which:

FIG. 2b is an illustration of blocking regions where solder paste blockage is looked for in the stencil apertures of FIG. 2a;

FIG. 2c is an illustration of smearing regions where smearing is looked for in the stencil apertures of FIG. 2a;

DETAILED DESCRIPTION

Figure 1:
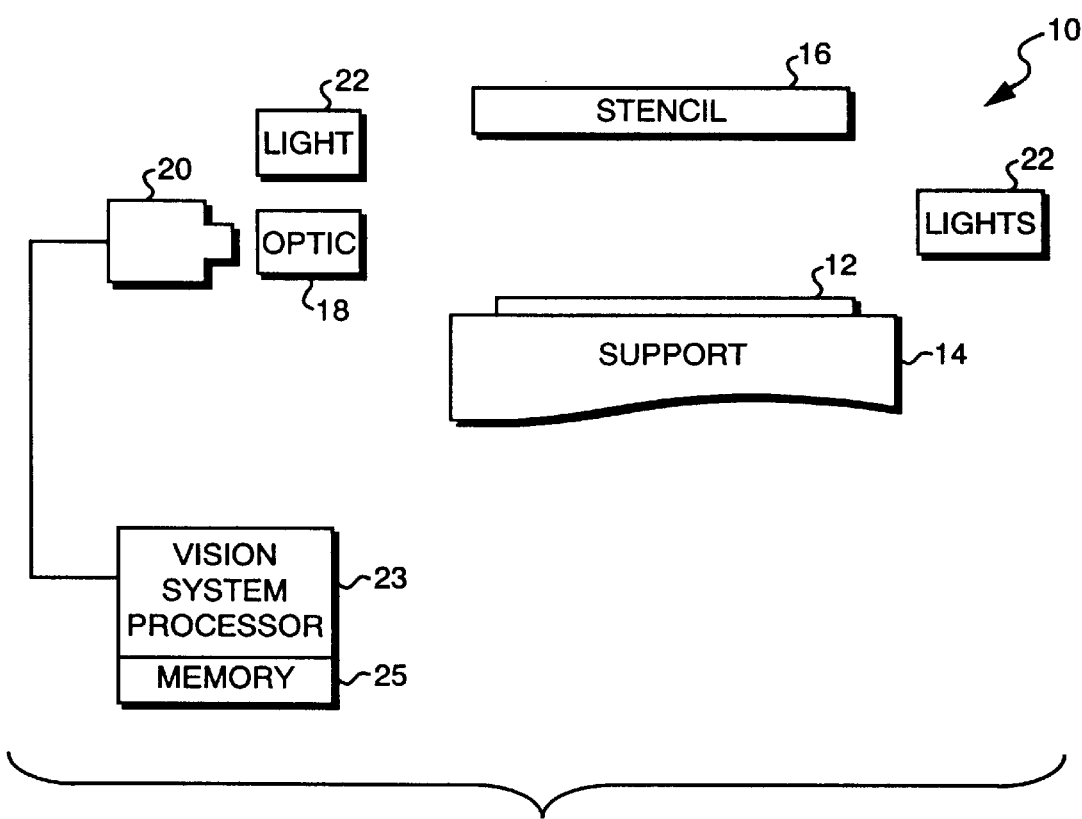
FIG. 1 is a schematic diagram of components of a screen printing system as known in the art.

The present invention is useful in the context of solder paste screen printing systems known in the art. Solder paste printing using screen printers is typically effected on bare printed circuit boards (PCBs) in a manufacturing production line prior to placement of components on the board. The bare PCB is placed on or transported to a screen printing station 10, such as illustrated in FIG. 1, whereat the PCB 12 is held firmly in place on a support 14 by either vacuum or mechanical means. The screen printing station includes an upper portion that houses a stencil 16 having apertures that correspond to areas of interest on the PCB, such as solder pads, where solder is to be disposed.

Optics 18, such as movable telecentric optics, a CCD camera 20 and flash lighting 22 all known in the art are used in conjunction with a vision system, such as a Cognex 5000 Series vision system and vision tools known in the art, to capture images of stencil 16 and board 12 fiducials to effect registration, i.e. alignment of the stencil to the board. It should be noted that the placement of lighting 22, the camera 20 and optics 18 is a function of the particular vision system configuration and application as known in the art, and as provided herewith FIG. 1 is not intended to be illustrative of any particular implementation or application. The illustrative system effecting the functionality described hereinafter incorporates a vision system processor 23 recieving signals, typically captured image signals, from the camera 22. The vision system processor 23 has access to a memory 25 in which it stores information processed in effecting the inspection system according to the invention.

Generally, in the screen printing process registration or alignment between the stencil and the PCB is accomplished, such as by a method involving registration of fiducials as described in commonly owned U.S. Pat. No. 5,550,906 which is incorporated herein by reference, and the stencil 16 is lowered or actuated to a position proximate to the PCB. The solder paste is deposited on a side of the stencil 16 away from the PCB and is pushed through apertures or openings in the stencil onto solder pad sites on the PCB 12 by means of a squeegee (not shown), that traverses the stencil at an appropriate speed while exerting appropriate pressure. The stencil 16 is then lifted or actuated away from the PCB 12, leaving solder paste deposits on pad sites corresponding to the apertures in the stencil.

More specifically, in an illustrative in-line solder paste inspection implementation according to the invention, prior to closing the fixture (i.e. moving the stencil proximate to the PCB for printing), the vision system captures images of areas of interest on both the stencil and board (the side of the stencil facing the board being somewhat of a "mirror image" of the board side facing the stencil). Substantially simultaneously, the vision system captures images of fiducials on the stencil and board for alignment purposes, and images of sites that are subject to inspection on the stencil and the board. Further, after printing of the solder paste on the PCB the stencil is actuated away from the PCB and post-printing images of the stencil and the PCB are captured to effect the inspection process as described in detail hereinafter.

Inspecting a given stencil and a given board may involve multiple images depending on the image size, the stencil and board size and the number of sites on a stencil and board that the user wants to inspect. In typical usage, multiple sites on each of the stencil and the board are inspected. Therefore, capturing of an image on each of the stencil and the PCB, both before and after printing, is effected as many times as is necessary to capture images of each of the relevant sites on a particular board in a particular inspection cycle. In a typical PCB manufacturing process it is most expedient to "tile" the stencil and PCB into a plurality of sites so that only images of relevant portions of the stencil and PCB are captured during stencil and board inspection in a given cycle. Tiling minimizes memory storage requirements for a given substrate or board under inspection.

Furthermore, it is preferable that the tiles of the stencil and PCB be captured in a round-robin fashion so that not every site is inspected on a given board in a given cycle. That is, processing and fabrication line speed is enhanced when inspection according to the invention is implemented such that only a portion of all of the relevant sites are captured and inspected on a given board, while another portion of the relevant sites are inspected on a successive board and still another portion are inspected on still another board. In this manner, an inspection cycle (i.e. inspection of every site on a given board type) is effected over a plurality of boards under inspection. The round robin inspection in conjunction with tiling facilitates better statistical analyses.

In the illustrative embodiment of the invention described hereinafter, stencil inspection is described first, however, it should be appreciated that PCB inspection as described hereinafter can be effected prior to stencil inspection. In the present implementation it is preferable to consider the stencil first because certain efficiencies can be achieved in the training and inspection processes, For example, information obtained in a training process for inspection of the stencil can optionally be used in a training process for inspection of the board, as described in detail hereinafter. Similarly, information derived in a registration process for the stencil can be used as a starting point to simplify and enhance the registration process for the PCB in the PCB inspection process, also described in detail hereinafter.

Prior to undertaking any inspection of the stencil, the vision system must be trained, as known in the art. Training is handled "off-line", i.e. prior to any inspection run, and in the case of stencil inspection basically involves constructing a model of the stencil by identifying stencil characteristics based on a "golden sample" or known good stencil. The stencil characteristics identified during training are related to sites of interest, in this case apertures in the stencil corresponding to the locations of solder pads on the PCB. Training in this illustrative embodiment is effected using vision tools with training capabilities, such as Cognex Blob Analysis Tool, which runs on the vision system used in the inspection system.

Figure 2A:
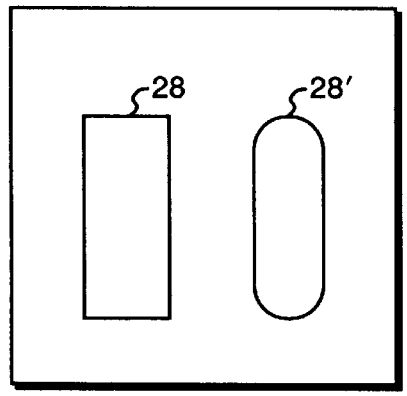
FIG. 2a is an illustration of stencil apertures corresponding to printing regions for receiving solder paste.

For each aperture 28, 28', such as illustrated in FIG. 2a, a data structure is constructed during training including a unique identifier for the aperture and characteristics of the aperture. Characteristics relating to and stored in association with each uniquely identified aperture include an aperture width, aperture height, and an X-Y location of the center of the aperture. For apertures with corner rounding (e.g. 28'), radial values indicative of curvature are also stored. When the Cognex Blob Analysis Tool is used for training, center of mass as determined by the Blob Analysis Tool as known in the art, is used as the X-Y location. Those skilled in the art will appreciate that median, mode or center of boundary box can also be used as the X-Y location.

Figure 2B:
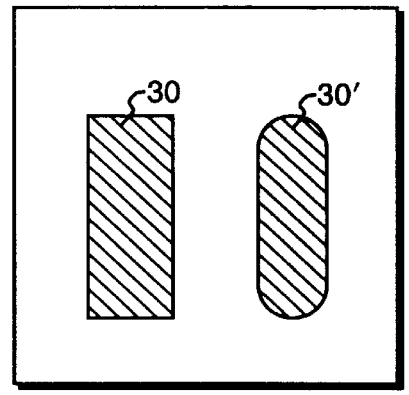
Figure 2C:
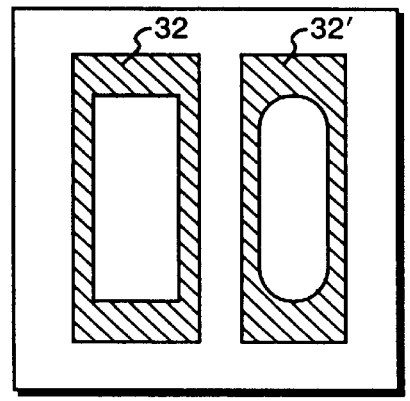

For each uniquely identified aperture a blockage region is specified during training, as illustrated in FIG. 2b. The blockage region 30, 30' is a region interior to the aperture 28, 28' which will be inspected for occlusion resulting from residual solder paste remaining on the stencil. Additionally, for each uniquely identified aperture a smear region is specified during training, as illustrated in FIG. 2c. The smear region 32, 32' is a region exterior to the aperture 28, 28' which will be inspected for the presence of solder paste resulting from residual solder paste remaining on the stencil.

Figure 2D:
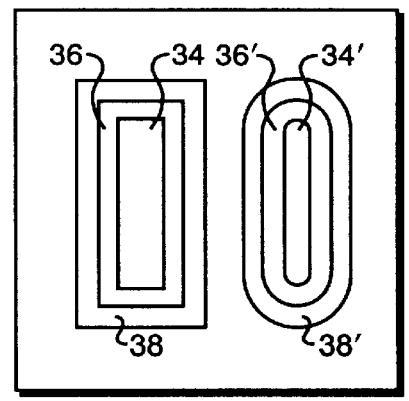
FIG. 2d is an illustration of runtime images of the apertures of FIG. 2a including the blocking regions of FIG. 2b and the smearing regions of FIG. 2c.

During a run-time inspection of the stencil as described in detail hereinafter, smearing and blockage might appear as illustrated in FIG. 2d. The extent of the open aperture 34, 34' may be impinged upon or restricted by blockage 36, 36' which will be detected as it resides within the specified blockage region. Likewise, smearing 38, 38' of solder paste will be detected on regions of the stencil exterior to the aperture which are within the specified smear region. Although not illustrated in FIGS. 2a–2d, the blockage region and smear region may be specified so as to incorporate a "don't care" region of several pixels between the outer edge of the blockage region and the inner edge of the smear region. Such a don't care zone is useful in that it removes from consideration the visual appearance at the stencil edge. The visual appearance at the stencil edge may be highly variable and extremely sensitive to lighting changes, squeegee position during printing, and aspects of the mechanical process used to form the aperture in the stencil.

Figure 3:
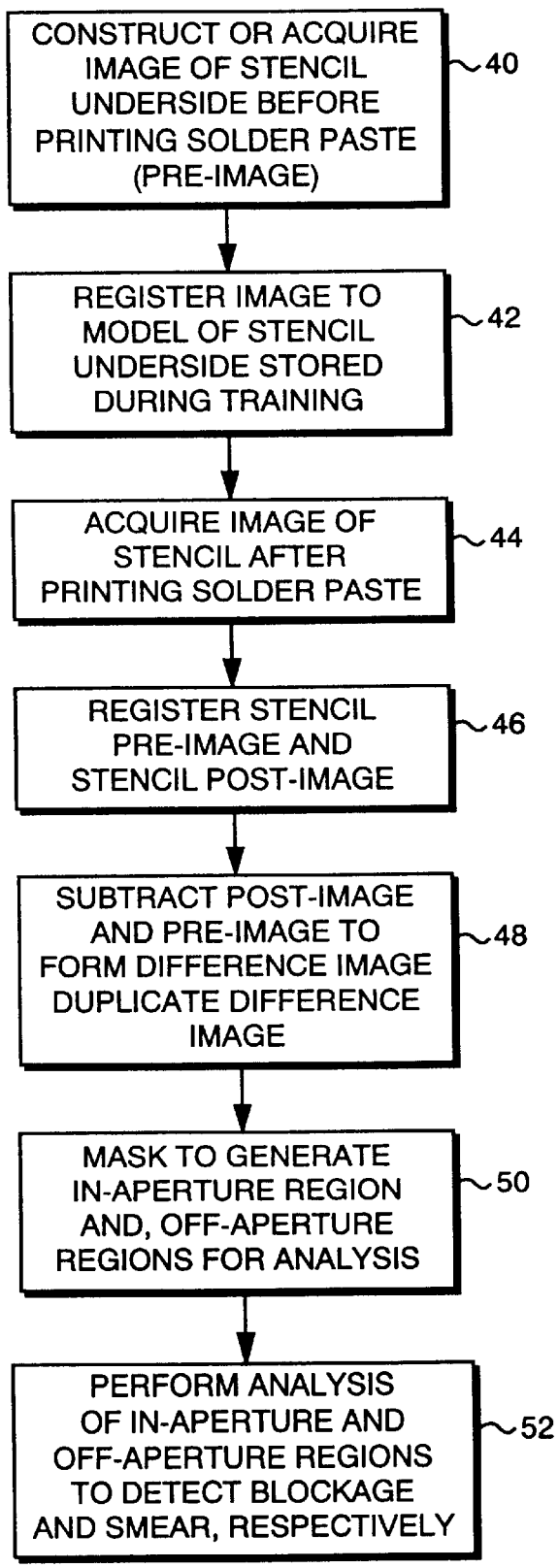
FIG. 3 is a flow diagram of process steps implementing stencil side inspection for a method and apparatus for in-line solder paste inspection according to the invention.

The stencil inspection process flow in the solder paste inspection procedure according to the invention is illustrated in FIG. 3. Initially an image of the stencil underside or side to be positioned adjacent to the PCB is acquired 40 before solder paste is printed, to obtain pre-printing image data (at times referred to herein as "stencil pre-image data"). The pre-image can be acquired immediately before printing a board in-process or it can be obtained well in advance of the screen printing process. While the pre-printing image or pre-image data in this illustrative embodiment is acquired in-line using the camera and optics available for registration of the stencil and PCB, as discussed hereinbefore, the data can be acquired as data files from automated machinery used to fabricate the stencil (or PCB). Similarly, the pre-image data can alternatively be synthesized from a geometric description of the stencil, including information about the location and size of each aperture, combined with calibration information required to calibrate the geometric description of the stencil to pixel size(s) and aspect ratio(s) of the camera imaging system that is used to acquire post-printing image data.

Inspecting a stencil may involve multiple images depending on the image size and stencil size and the number of sites on a stencil that the user wishes to inspect, thus acquisition or construction of stencil pre-image data is effected for each site on a stencil that is to be inspected. Subsequent steps in the inspection process are performed as many times as necessary to effect inspection of each site for which pre-image data (and post-image data) is acquired.

The image acquired by the camera imaging system is registered 42 to the model of the stencil stored during training. This initial registration effectively aligns the selected sites where the apertures are on the stencil image acquired before printing (the pre-image), with the selected sites of the apertures on the model stencil image stored during training. Registration compensates for any differences in the coordinate systems of the respective acquired images. This initial registration is accomplished by performing two one-dimensional registrations, one in the X and one in the Y, on projections, as known in the art, of the model and stencil images. Registration is achieved when there is maximum correlation between the projections in each dimension. The initial registration can alternatively be effected by vision tools known in the art, such as described in U.S. Pat. No. 5,548,326 entitled EFFICIENT IMAGE REGISTRATION which is incorporated herein by reference. Registration can be implemented as well, with other vision tools using fiducials on the stencil.

After the pre-image data is acquired and after registration of the pre-image and the model image, printing of the solder paste can be effected.

Thereafter, the camera acquires an image of the stencil underside after solder paste 44 has been printed on the circuit board (the "stencil post-image"). The stencil post-image corresponds to the same stencil or section of stencil that was acquired before the screen printing of the solder paste.

The stencil pre-image and the stencil post-image are then registered to one another 46. Registration of the pre-image to the post-image can have several degrees of freedom, such as translation (2 degree), rotation, scale, skew, etc. In the present implementation, rotation, scale and skew are minimized and registration (both pre-image to model image and pre-image to post-image) is effected for translation only. A preferred method for pre-image to post-image registration is to use the technique of Efficient Image Registration (U.S. Pat. No. 5,548,326) which can align two images of an object that has undergone a manufacturing process. However, other techniques such as Cognex's Normalized Correlation Search tool, Cognex's Caliper Tool, or Cognex's CNL-PAS tool could also be used to align the two images. It should be appreciated that pre-image to post-image registration works best if there are no changes in lighting between acquisition of the respective images.

The registration step 46 allows information from the bare stencil (pre-image) to be combined with information from the stencil after screen printing with paste (post-image). The two aligned images, i.e. the pre-image and the post-image, can be effectively combined by optionally subtracting one from another 48 yielding a difference image with pixel values that are signed quantities (i.e. positive or negative). The positive value of pixels in the difference image represent blockage when those pixels appear in the blockage region of the aperture. The negative value pixels represent smear when those pixels appear in the smear region.

The difference image is then separated into two images for separate processing of positive value pixels and negative value pixels. An expeditious method of separating the difference image is to duplicate the image to form a positive value image and a negative value image, and then replace all of the negative pixels in the positive value image with don't cares (i.e. zeros) and replace all of the positive value pixels in the negative value image with don't cares. All pixels in the negative image can then be replaced with their absolute values for mathematical convenience, and the positive value image and the absolute value image can be separately processed.

The subtraction step 48 is optional because it may not be necessary to subtract and obtain a difference image (representative of difference in gray value) in order to clearly distinguish locations where there is paste from locations where there is no paste. In situations where there is significant contrast in color (and consequently significant disparity in gray value) between paste and non-paste areas, a binary image can be generated based on discriminating one gray value (or range of gray values) as representative of paste and another gray value (or range) as representative of other than paste, i.e. stencil background. The alignment effected by registration between the pre-image and the post-printing binary image clearly indicating paste locations, facilitates detection of paste in the blockage and smear regions (defined during training).

The difference image (if necessary) or the binary image contains information clearly indicative of the location(s) of solder paste on the stencil or in the aperture(s). It is desirable to separately process aperture information in order to detect blockage and stencil background information in order to detect smear. A mask is generated using stencil training information to define in-aperture and off-aperture regions. It should be appreciated that the mask can also be generated by thresholding the pre-image. The mask is applied 50 to the difference (or binary) image to mask out the aperture area from the stencil background area so that those two groups of image regions can be processed separately.

Analysis of the in-aperture region and the off-aperture region 52 can then be effected by using a connected components analysis as known in the art. Alternatively, Cognex's Blob Analysis Tool can be used to measure paste distribution on the stencil. Cognex's Blob Analysis Tool provides information such as area, center of mass, orientation, moments, and extent. In this illustrative embodiment, area measurements of blockage and smear are the measurements of primary interest. The regions of interest for applying the Blob Analysis Tool are the registered stencil openings for paste blockage and around the stencil openings for paste smearing. The exact locations of the openings are known because the aperture locations are known from the pre-image acquired before screen printing and the relative position changes of the apertures are known from the post-image acquired after solder paste screen printing.

Printed circuit board inspection described in detail hereinafter is effected in a substantially similar manner as the stencil inspection described in detail hereinbefore. As with the stencil, prior to undertaking any inspection of the PCB, the vision system must be trained, as known in the art. Training for the PCB is also handled "off-line" prior to any inspection run. Like in the case of stencil, PCB training basically involves constructing a model of the PCB by identifying PCB areas of interest and characteristics. The PCB characteristics identified during training are related to sites of interest, which in the PCB case are solder pads corresponding to apertures in the stencil.

As with the stencil side, PCB inspection training is effected by acquiring an image of a known good entity, in this case a PCB, and constructing a model of characteristics of interest, in this case solder blobs on solder pads. Generally, PCB training is used to define a model image based on a registration window within a field of view. The model of the PCB constructed during training will result from consideration of where the solder is supposed to go as defined by a baseline location of the pads of interest and location(s) on the pad where solder is properly deposited.

As with the stencil side training, training for the PCB in this illustrative embodiment is effected using vision tools with training capabilities, such as Cognex Blob Analysis Tool, which runs on the vision system used in the inspection system.

For each registration window selected within a field of view, a data structure is constructed during training including a unique identifier for the pads of interest. Further, characteristics for each of the pads are stored in the data structure in association with the pads unique identifier, including: the pad's width, height, X-Y location, and any corner curvature information. As with the stencil training procedure, PCB training for pad information is effected using a vision tool such as Cognex's Blob Analysis tool or other vision tool having training capabilities as known in the art.

In addition to information relating to the pads, training for the printed circuit board inspection may involve gathering information relating to solder bricks or blobs deposited on a known good PCB. In such a case, where certain of the information relating to the solder is a function of characteristics of the stencil used to deposit the solder, the efficiency of the process can be enhanced by using, in the training for the PCB, certain information obtained in training for the stencil. Specifically, a given solder brick can be identified and correlated to a known aperture on the stencil already trained for. Width and height information for respective apertures can be used as width and height information for corresponding solder depositions in training for the PCB. Similarly, the X-Y location of the respective apertures can be used for a starting point for determining the X-Y location of the corresponding pads in gathering characteristics or training for the PCB. The training process for the PCB may be implemented to utilize virtually all of the characteristics relating to and stored in association with each uniquely identified aperture, including the aperture width, aperture height, and X-Y location, and for apertures with corner rounding the radial values indicative of curvature can be used. It should be appreciated that the training information relating to the stencil is a "mirror image" of the information as it would relate to the PCB, therefore in order to use the stencil information it must be processed accordingly. It should also be appreciated, as previously mentioned, that training for the PCB can be done as with the stencil, by using a vision tool such as Cognex's Blob Analysis tool or other vision tool having training capabilities as known in the art.

Figure 4:
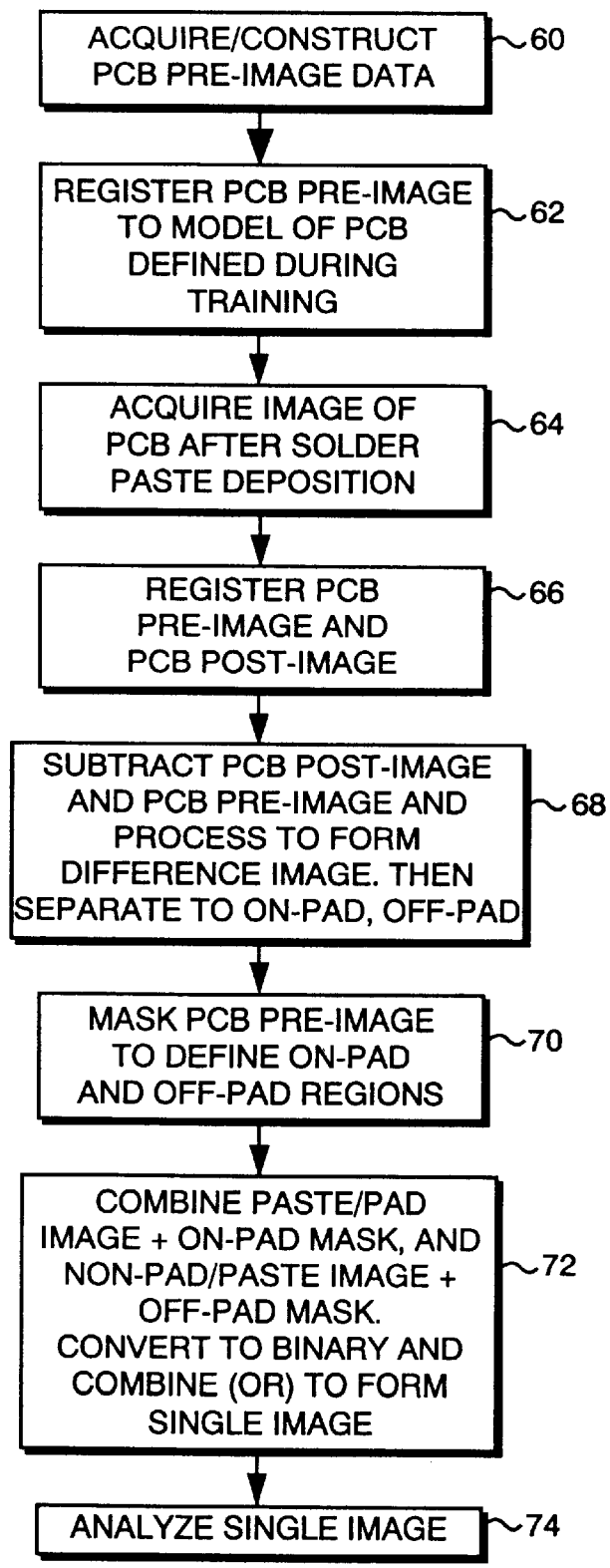
FIG. 4 is a flow diagram of process steps implementing printed circuit board side inspection for a method and apparatus for in-line solder paste inspection according to the invention.

The PCB inspection process flow is illustrated in FIG. 4. Initially an image of the PCB is acquired 60 before solder paste is printed, to obtain pre-printing image data (at times referred to herein as "PCB pre-image data"). As with the stencil, the image can be acquired immediately before printing a board in-process or it can be obtained well in advance of the screen printing process. While the pre-printing image or PCB pre-image data in this illustrative embodiment is acquired in-line using the camera and optics available for registration of the stencil and PCB, as discussed hereinbefore, the data can be acquired as data files from automated machinery used to fabricate the PCB, as known in the art.

Inspecting the PCB, as with the stencil, may involve multiple images depending on the image size and board size and the number of sites on the board that the user wishes to inspect. Thus acquisition or construction of PCB pre-image data is effected for each site on the board that is to be inspected. Subsequent steps in the inspection process are performed as many times as necessary to effect inspection of each site for which pre-image data (and post-image data) is acquired.

The pre-image, acquired by a camera imaging system, is registered 62 to the model of the PCB stored during training.

This initial registration effectively aligns the selected sites of interest on the PCB image acquired before printing (the pre-image), with the selected sites of interest on the model PCB image stored during training. This initial registration can be efficiently undertaken using a vision tool effecting normalized correlation as known in the art, which allows linear changes in brightness to be ignored when registering the model to the pre-image. As with the initial registration in the stencil inspection, initial registration in the PCB inspection can be implemented as well, with other vision tools using fiducials on the stencil. Similarly, the initial registration can be effected by vision tools known in the art, such as described in the referenced U.S. Pat. No. 5,548,326 entitled EFFICIENT IMAGE REGISTRATION.

After the pre-image data is acquired 60 and registered 62, printing of the solder paste on the PCB can be effected.

After solder paste has been printed on the circuit board, the camera acquires an image of the PCB (the "PCB post-image") 64. The PCB post-image corresponds to the same PCB or section of PCB that was acquired before the screen printing of the solder paste.

The PCB pre-image and the PCB post-image are then registered to one another 66. Again, a preferred method for pre-image to post-image registration is to use the technique of Efficient Image Registration (U.S. Pat. No. 5,548,326) which can align two images of an object that has undergone a manufacturing process. However, other techniques such as Cognex's Normalized Correlation Search tool, Cognex's Caliper Tool, or Cognex's CNL-PAS tool could also be used to align the two images. The registration step 66 allows information from the PCB before printing (PCB pre-image) to be combined with information from the PCB after screen printing with paste (PCB post-image).

The two registered or aligned images, i.e. the PCB pre-image and the PCB post-image can be effectively combined by optionally subtracting one from another 68 yielding a difference image with pixel values that are signed quantities (i.e. positive or negative). Since solder paste is generally darker than printed circuit board pads and brighter than printed circuit board background, the positive value pixels in the difference image represent solder paste on the pads and the negative value pixels represent solder paste off the pads and on the printed circuit board background. Zero value pixels may result in the difference image, which represent either locations without solder paste or locations where the solder paste happens to have the same gray value as the printed circuit board proximate to it. Zero value pixels are "don't care" pixels, i.e. of no interest.

The difference image is then separated into two images for separate processing of positive value pixels and negative value pixels. An expeditious method of separating the difference image is to duplicate the image in order to form a positive value image and a negative value image. This is accomplished by replacing all of the negative pixels in the positive value image with don't cares (i.e. zeros) and replacing all of the positive value pixels in the negative value image with don't cares. All pixels in the negative image can then be replaced with their absolute values to form an absolute value image. Thus the positive value image constitutes a solder paste/pad image representative of solder paste on pads and the absolute value image constitutes a non-pad/paste image representative of solder paste off the pads and on the printed circuit board background.

As with the stencil side processing, the subtraction step 68 is optional because it may not be necessary to subtract and obtain a difference image (representative of difference in gray value) in order to clearly distinguish locations where there is paste from locations where there is no paste. In situations where there is significant contrast in color (and consequently significant disparity in gray value) between paste on pad and non-pad/paste areas, a binary image can be generated based on discriminating one gray value (or range of gray values) as representative of paste on pad and another gray value (or range) as representative of other-than-pad paste areas, i.e. PCB background. The alignment effected by registration between the pre-image and the post-printing binary image clearly indicating paste locations, facilitates inspection and detection of paste locations (as defined during training).

Figure 5A:
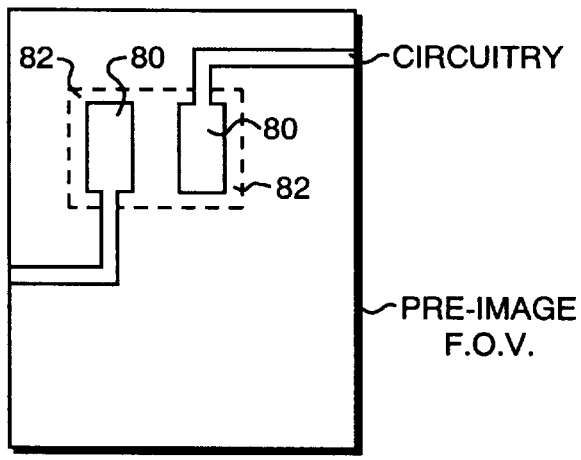
FIG. 5a is an illustration of a pre-image with defined on-pad regions and off-pad regions.

The difference images (if necessary) or the binary image contains information clearly indicative of the location(s) of solder paste. It is desirable to mask out the pads from the PCB background so that it is possible to separately process pad information and non-pad or background information. That is, for purposes of further processing and analysis to determine the location of solder on pads and the location of solder off of the pads (likely causing bridges between fine pitch or closely spaced pads), masks are used to select out and independently process pad information and PCB background information. A mask is generated and applied 70 using PCB training information to define on-pad regions 80 and off-pad regions 82 as illustrated in FIG. 5a. Masking in this illustrative embodiment is based on the relative gray value of areas of the PCB, and is accomplished by setting a threshold on the PCB pre-image and designating all pixels in that image having a gray value greater than (or equal to) the threshold to be on-pad regions 80, and designating all pixels with gray values less than (or equal to) the threshold to be off-pad regions 82. Optionally, a connected components analysis as known in the art can be effected on the on-pad regions to ensure that the pads are a minimum size.

Figure 5B:
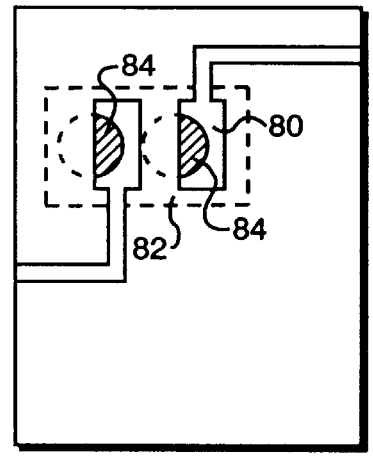
FIG. 5b is an illustration of an on-pad difference image representative of the position of solder paste on solder pads.
Figure 5C:
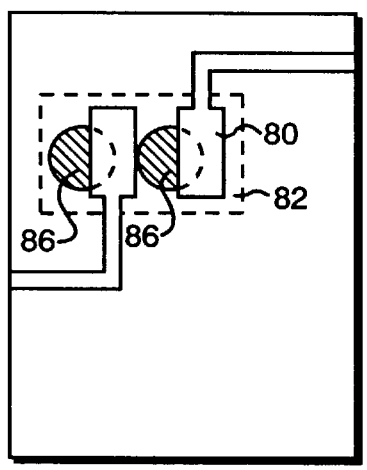
FIG. 5c is an illustration of an off-pad difference image representative of the position of solder paste on areas of the board other than the pads.

In a combining operation 72, the on-pad mask is logically ANDed with the solder paste/pad image to form an on-pad difference image, illustrated in FIG. 5b, representative of the position of solder paste on the pads 84. The off-pad mask is logically ANDed with the non-pad/paste image to form an off-pad difference image, illustrated in FIG. 5c, representative of the position of solder paste on areas of the board other than the pads 86.

The on-pad difference image and the off-pad difference image are converted, using thresholding operations with different respective thresholds, to respective first and second binary images. The thresholds are locally adjusted, that is, every pixel in the image has its own threshold, based on the pre-image, so that when the pre-image gray scale value is nearer to the paste gray scale value the threshold is (linearly) smaller. The paste gray value is determined by statistically sampling known paste pixels at runtime.

In the present illustrative embodiment, the off-pad thresholds are calculated as a fraction of the filtered post-image and the on-pad thresholds are calculated as a fraction of the filtered pre-image, i.e. the gray scale values of each pixel in the respective image are each multiplied by a fractional value. The fractional values are determined empirically such that the locally calculated thresholds will be effectively empirically derived as a function of the lighting, type of paste, board color and factors affecting the vision system. The thresholds can be calculated locally based on a fraction of the pre-image or a filtered pre-image gray scale value. Local thresholding is described in detail in commonly owned, copending U.S. patent application Ser. No. 08/716, 779 filed Jul. 22, 1998 by Nichani entitled SYSTEM OR METHOD FOR DETECTING DEFECTS WITH A SEMI- OPAQUE ENCLOSURE, which is incorporated herein by reference. Alternatively the thresholds can be an empirically derived fixed quantity.

Figure 5D:
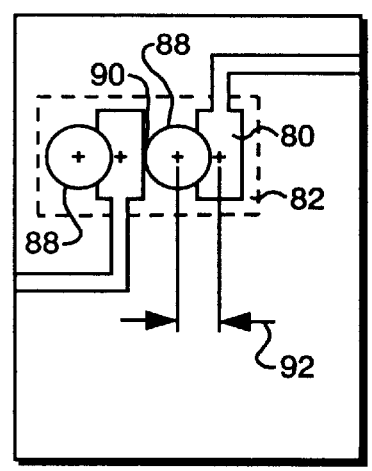
FIG. 5d is an illustration of an image representative of solder paste on the printed circuit board.

The respective first and second binary images are in turn combined by a logical OR operation to form a single binary image, illustrated in FIG. 5d, representative of solder paste 88 on the printed circuit board.

The single binary image is then analyzed 74 using a connected components analysis method as known in the art, or by using a known vision tool to measure paste distribution and/or to determine information regarding the solder paste, such as area, center of mass, orientation, etc. From the paste area distribution and two sets of image registrations, other useful quantities can be derived, as known in the art, such as indications of bridging between solder blobs and print offset(s).

Bridging 90, the misplacement of solder in a manner that results in an erroneous electrical connection between adjacent pads or between a pad and conductive surface proximate thereto as illustrated in FIG. 5d, is determined by calculating the boundary of the paste region and measuring its proximity to neighboring pads.

Print offset 92, also illustrated in FIG. 5d, is a deviation in position between where the paste was actually printed relative to where it was supposed to be printed as defined at training time. There are two sets of information generated relating to two "types" of print offset in the system according to the invention.

A first print offset calculation relates offset of the center of mass of each of the individual solder blobs to the center of mass of its respective or corresponding solder pad, determining offset therebetween. The first print offset calculation makes available an offset for each of the individual solder blobs.

A second print offset calculation determines an aggregate offset of all of the solder paste blobs inspected relative to where they are supposed to be printed on their respective solder pads. The second print offset calculation effectively correlates a synthesized, mirrored stencil image to the single binary image representing solder on the board, enabling a "global" view of the results of the printing process. Such an aggregate view can be achieved as well by taking an average of all of the individual offsets determined according to the first print offset calculation(s).

Again, Cognex's Blob Analysis Tool can be used to measure paste distribution on the PCB. Cognex's Blob Analysis Tool provides information such as area, center of mass, orientation, moments, and extent. Illustrative regions of interest for applying the Blob Analysis Tool on the PCB are the registered solder pads and center of mass of the solder blobs for detecting print offset, and around the solder pads, i.e. between adjacent solder pads for detecting bridging. The exact locations of the pads are known from the pre-image acquired before screen printing and the relative position of the solder paste to the pads is known from the post-image acquired after solder paste screen printing.

It should be appreciated that vision tools implemented in conjunction with the inspection methodology described hereinbefore can be used to inspect for various other aspects related to the screen printed material, i.e. other than bridging and print offset, such as dross presence (i.e. extra paste not associated with any solder pad deposition), total paste coverage or the like.

Those skilled in the art will appreciate that some, or all, of the steps of subtraction, masking, thresholding, ANDing and ORing described hereinbefore can be combined and effected as hardware implementations, software implementations or a combination thereof, and that although a vision system is described implemented with a Cognex vision system and vision tools, the invention can be implemented on other platforms, such as general purpose computers running software and/or configured with hardware to effect the functionality described herein.

The local thresholding described herein can also be accomplished in various ways, such as by taking the square root of the pre-image, or by computing some linear or non-linear function of a respective image (i.e. model image, pre-image or post-image), or by using a constant.

It should be further appreciated with respect to the foregoing, that it is not necessary to acquire pre-printing image information before every printing operation and that a database of information can be stored and accessed to obtain pre-printing image information. The database of information can be from a captured image, downloaded from a Computer Aided Design tool or otherwise acquired. Likewise, for purposes of efficiency and expediency it is not necessary to acquire a post-printing image after every printing operation. Post-printing information can be acquired periodically, as necessary to keep the process within some appropriate user defined control limits.

While the system described herein acquires and stores an entire pre-image it will be appreciated that instead of storing an entire pre-image portions of an image constituting useful information can be stored and used to synthesize a pre-image during runtime. Similarly, limited useful information from the captured pre-image, such as a gray level histogram, can be stored and used to determine gray levels in the post-image for binarizing.

Additionally, while two aligned images, i.e. the pre-image and the post-image, are described herein as being effectively combined by optionally subtracting one from another yielding a difference image with pixel values that are signed quantities (i.e. positive or negative), it should be appreciated that analogs of the pre and post images, such as filtered or re-mapped images can be processed and combined to yield a "difference image" that has unsigned pixel values.

Furthermore, while other operations are described herein utilizing the pre-image and the post-image, it should be appreciated that any of the images described herein can be subject to further processing, such as by filtering using a gaussian filter, median filter, smoothing filter, morphological filter or the like known in the art, in order to improve image quality.

Although a training process is described herein using a specified, known in the art vision tool (i.e. Cognex Blob Analysis Tool) for obtaining characteristics relating to the apertures for the stencil side inspection and the solder pads for the PCB side inspection, it should be appreciated that a data base of information relating to the characteristics of the stencil and the board can be obtained using other vision tools, such as Cognex Caliper Tool or from a CAD tool or other machinery that requires or acquires and has information relating to the characteristics of interest, such as automated tooling used to cut the stencil or other tooling used to fabricate the PCB. Alternatively, training information can be manually obtained by an operator and entered into the system.

It will be appreciated that although the invention described in an illustrative embodiment herein effects inspection of solder paste applied to printed circuit boards, it can be similarly implemented in processes to effect inspection of other materials such as screen printed adhesives, conductive adhesives or the like, applied on substrates other than printed circuit boards. Furthermore, although the invention is described in an "in-line" implementation with a screen printing process, the invention can be implemented and/or the inventive concepts herein modified to be used to inspect solder paste or adhesives applied in other ways. That is, efficient, robust inspection can be effected as described hereinbefore using a before image and an after image, regardless of how the material added to the after image is applied.

While the method and apparatus described herein use a masking operation that involves application of a threshold to a pre-printed image to form on-pad and off-pad masks, it should be appreciated that other means of masking or mask generation can be implemented in order to distinguish between the areas of interest and other areas that may be inspected.

Although in the method and apparatus described hereinbefore on-pad and off-pad images are described as logically ANDed with respective masks, and two threshold difference images are described as logically ORed to effect a single binary image, it will be appreciated that other means of combining the respective images can be effected to arrive at images or an image representative of the logically combined images.

Although the invention has been shown and described with respect to exemplary embodiments thereof, various other changes, omissions and additions in the form and detail thereof may be made therein without departing from the spirit and scope of the invention.

What is claimed is:

1. A method of using a vision system to inspect a material applied in at least one predefined pattern on a portion of a substrate, said method comprising the steps of:

acquiring a model set of characteristics of said portion of said substrate and said at least one predefined pattern from a model substrate;

acquiring a pre-application set of characteristics of said portion of said substrate before said material is applied on said substrate;

performing a first registration to align said pre-application set of characteristics to said model set of characteristics to form an aligned pre-application set of characteristics;

acquiring a post-application set of characteristics of said portion of said substrate and said at least one predefined pattern after said material is applied on said substrate;

performing a second registration to align said post-application set of characteristics to said aligned pre-application set of characteristics to form an aligned post-application set of characteristics;

processing said aligned pre-application set of characteristics and said aligned post-application set of characteristics to provide an image representative of said material applied in said at least one predefined pattern on said portion of said substrate; and analyzing said image representative of said material applied on said portion of said substrate to determine information about said material applied in said at least one predefined pattern on said substrate relative to said portion of said substrate.

2. The method of claim 1 wherein said material is solder paste and said substrate on which said material is applied is a printed circuit board (PCB).

3. The method of claim 2 wherein said solder paste is applied to said substrate by screen printing.

4. The method of claim 2 wherein said portion of said substrate is a solder pad on said PCB and said at least one predefined pattern is a solder paste blob.

5. The method of claim 4 wherein said step of acquiring said model set of characteristics of said portion of said substrate and said at least one predefined pattern involves training said vision system by constructing at least one data structure including solder pad data corresponding to a width of said solder pad, a height of said solder pad, and a location of said solder pad.

6. The method of claim 5 wherein said solder pad includes curved features and said at least one data structure further includes radial values characterizing said curved features.

7. The method of claim 5 wherein said at least one data structure further includes solder paste blob data corresponding to a width of said solder paste blob, a height of said solder paste blob, and a location of said solder paste blob.

8. The method of claim 7 wherein said solder paste blob includes curved features and said data structure further includes radial values characterizing said curved features.

9. The method of claim 2 wherein said vision system comprises a camera and a memory and said step of acquiring a pre-application set of characteristics of said portion of said substrate before said material is applied involves capturing an image of at least a part of said PCB using said camera and storing a captured image in said memory as a pre-image.

10. The method of claim 2 wherein said step of performing a first registration involves aligning an image of at least a part of said PCB with an image of at least a part of a model PCB comprising said model set of characteristics.

11. The method of claim 2 wherein said vision system comprises a camera and a memory and said step of acquiring a post-application set of characteristics involves capturing an image of at least a part of said PCB using said camera and storing said captured image in said memory as a post-image.

12. The method of claim 9 wherein said vision system comprises a camera and a memory and said step of acquiring a post-application set of characteristics involves capturing an image of at least a part of said PCB using said camera and storing said captured image in said memory as a post-image and wherein said step of performing a second registration involves aligning said post-image to said pre-image in order to facilitate combining said post-image and said pre-image.

13. The method of claim 12 wherein said step of processing said aligned pre-application set of characteristics and said aligned post-application set of characteristics involves combining said post-image and said pre-image to provide a combined image comprising first pixel values representative of solder paste applied on solder pads on said PCB and second pixel values representative of solder paste on said PCB in areas other than on solder pads.

14. The method of claim 13 wherein combining said post-image and said pre-image involves performing an image subtraction process in which a subtraction operation is performed with said post-image and said pre-image to provide said combined image which is a difference image comprising said first pixel values as signed values representative of solder paste applied on solder pads on said PCB and said second pixel values as signed pixel values representative of solder paste on said PCB in areas other than on solder pads, and wherein said difference image is duplicated and processed to provide a solder paste/pad image having information related to solder paste located on solder pads and a non-paste/pad image having information related to solder paste located on said PCB in areas other than on solder pads.

15. The method of claim 14 further comprising steps of, creating masks to effect a separation of said pre-image into an on-pad area image having information relating to solder pad areas and an off-pad area image having information relating to said PCB in areas other than on solder pads;

combining said on-pad mask with said solder paste/pad image to form an on-pad difference image representative of position of solder paste on said solder pads;

combining said off-pad mask with said non-pad/paste image to form an off-pad difference image representative of position of solder paste on areas of said PCB other than on said solder pads;

converting said on-pad difference image and said off-pad difference image, using thresholding operations, to a first binary image and a second binary image respectively; and combining said first binary image and said second binary image to form a single binary image representative of solder paste area distribution on said PCB.

16. The method of claim 15 wherein the step of combining said on-pad mask with said solder paste/pad image to form an on-pad difference image is effected by logically ANDing said on-pad mask with said solder paste/pad image.

17. The method of claim 15 wherein the steps of combining said off-pad mask with said non-pad/paste image to form an off-pad difference image is effected by logically ANDing said off-pad mask with said non-pad/paste image.

18. The method of claim 15 wherein the step of converting said on-pad difference image and said off-pad difference image to a first binary image and a second binary image respectively, using thresholding operations, involves using different respective thresholds for each pixel in the respective images which thresholds are locally adjusted based on said pre-image.

19. The method of claim 15 wherein the step of combining said first binary image and said second binary image to form a single binary image representative of solder paste on said PCB is effected by logiacally ORing said first binary image and said second binary image.

20. The method of claim 1 wherein the step of performing a first registration involves using normalized correlation to align said pre-application set of characteristics to said model set of characteristics.

21. The method of claim 1 wherein said step of analyzing said image representative of said material applied on said portion of said substrate includes analyzing said image as a single binary image, using a connected components analysis method to determine area of distribution of said material.

22. The method of claim 1 wherein said step of analyzing said image representative of said material applied on said portion of said substrate includes analyzing said image as a single binary image, to measure at least one of area, center of mass, and orientation of said at least one predefined pattern.

23. The method of claim 1 wherein said step of analyzing said image representative of said material applied on said portion of said substrate includes analyzing said image to determine at least one of: indications of bridging between depositions of said material; and offset between centers of mass of respective ones of said at least one predefined pattern and respective ones of said portion of said substrate.

24. The method of claim 1 wherein said material is applied in said at least one predefined pattern on said portion of said substrate using a stencil having at least one aperture corresponding to said at least one predefined pattern, and wherein said stencil is periodically inspected according to a stencil inspection method comprising the steps of:

acquiring a stencil model set of characteristics of said at least one predefined aperture from a model stencil;

acquiring a stencil pre-application set of characteristics of said at least one predefined aperture before said material is applied on said substrate;

performing a first stencil image registration to align said stencil pre-application set of characteristics to said stencil model set of characteristics to form an aligned stencil pre-application set of characteristics;

acquiring a stencil post-application set of characteristics of said at least one predefined aperture after said material is applied on said substrate;

performing a second stencil image registration to align said stencil post-application set of characteristics to said aligned stencil pre-application set of characteristics to form an aligned stencil post-application set of characteristics;

processing said aligned stencil pre-application set of characteristics and said aligned stencil post-application set of characteristics to provide a stencil image representative of said material in and proximate to said at least one aperture; and analyzing said stencil image representative of said material in and proximate to said at least one aperture to determine information about location of said material.

25. The method of claim 24 wherein said step of acquiring a stencil model set of characteristics of said at least one predefined aperture from a model stencil further includes defining at least one blockage region corresponding to said at least one aperture and where inspection is effected for blockage of said at least one aperture using said vision system.

26. The method of claim 24 wherein said step of acquiring a stencil model set of characteristics of said at least one predefined aperture from a model stencil further includes defining at least one smear region corresponding to said at least one aperture and where inspection is effected for smear of said material proximate said at least one aperture using said vision system.

27. A system configured for inspecting a material applied in at least one predefined pattern on a portion of a substrate, said system comprising:

a camera configured to acquire a model set of characteristics of said portion of said substrate and said at least one predefined pattern from a model substrate, said camera being further configured to acquire a pre-application set of characteristics of said portion of said substrate before said material is applied on said substrate;

a processor receiving from said camera said model set of characteristics of said portion of said substrate and said at least one predefined pattern, and said pre-application set of characteristics of said portion of said substrate, said processor performing a first registration to align said pre-application set of characteristics to said model set of characteristics to form an aligned pre-application set of characteristics; and a memory accessible to said processor, receiving therefrom and storing said aligned pre-application set of characteristics, wherein said camera further acquires a post-application set of characteristics of said portion of said substrate and said at least one predefined pattern after said material is applied on said substrate, and said processor performs a second registration to align said post-application set of characteristics to said aligned pre-application set of characteristics to form an aligned post-application set of characteristics and processes said aligned pre-application set of characteristics and said aligned post-application set of characteristics to provide an image representative of said material applied in said at least one predefined pattern on said portion of said substrate.

28. The system of claim 27 wherein said processor is configured to analyze said image representative of said material applied on said portion of said substrate to determine information about said material applied in said at least one predefined pattern on said substrate relative to said portion of said substrate.

29. The system of claim 27 wherein said material is solder paste and said substrate on which said material is applied is a printed circuit board (PCB).

30. The system of claim 29 wherein said solder paste is applied to said substrate by screen printing.

31. The system of claim 29 wherein said portion of said substrate is a solder pad on said PCB and said at least one predefined pattern is a solder paste blob.

32. The system of claim 31 wherein said model set of characteristics of said portion of said substrate and said at least one predefined pattern is stored in said memory by constructing at least one data structure including solder pad data corresponding to a width of said solder pad, a height of said solder pad, and a location of said solder pad.

33. The system of claim 32 wherein said solder pad includes curved features and said at least one data structure further includes radial values characterizing said curved features.

* * * * *